United States Patent
Kirkby et al.

(10) Patent No.: US 12,519,003 B2
(45) Date of Patent: Jan. 6, 2026

(54) TRANSFER APPARATUS CAPABLE OF SUPPRESSING SIDE SLIP OF WORKPIECE LIFTED BY NON-CONTACT CHUCK

(71) Applicant: Yamaha Robotics Co., Ltd., Tokyo (JP)

(72) Inventors: Michael Kirkby, Tokyo (JP); Hiroshi Munakata, Tokyo (JP); Takuya Adachi, Tokyo (JP)

(73) Assignee: Yamaha Robotics Co., Ltd., Tokyo (JP)

( * ) Notice: Subject to any disclaimer, the term of this patent is extended or adjusted under 35 U.S.C. 154(b) by 962 days.

(21) Appl. No.: 17/640,827

(22) PCT Filed: Mar. 8, 2021

(86) PCT No.: PCT/JP2021/009036
§ 371 (c)(1),
(2) Date: Mar. 6, 2022

(87) PCT Pub. No.: WO2022/190174
PCT Pub. Date: Sep. 15, 2022

(65) Prior Publication Data
US 2023/0197497 A1    Jun. 22, 2023

(51) Int. Cl.
*H01L 21/683*    (2006.01)

(52) U.S. Cl.
CPC ................ *H01L 21/6838* (2013.01)

(58) Field of Classification Search
CPC ............ H01L 21/6838; H01L 21/68707; B25J 15/0014; B25J 15/0052
USPC ..................................................... 294/64.3
See application file for complete search history.

(56) References Cited

U.S. PATENT DOCUMENTS

| | | | |
|---|---|---|---|
| 5,810,155 A * | 9/1998 | Hashimoto | B65G 27/00 198/752.1 |
| 5,979,475 A * | 11/1999 | Satoh | H01L 21/67017 134/140 |
| 7,168,747 B2 | 1/2007 | Hoehn et al. | |
| 9,360,772 B2 * | 6/2016 | Shibazaki | G03F 7/70133 |

(Continued)

FOREIGN PATENT DOCUMENTS

| CN | 1462253 | 12/2003 |
|---|---|---|
| JP | 2008227480 | 9/2008 |

(Continued)

OTHER PUBLICATIONS

"International Search Report (Form PCT/ISA/210) of PCT/JP2021/009036," mailed on Jun. 1, 2021, pp. 1-3.

(Continued)

*Primary Examiner* — Paul T Chin
(74) *Attorney, Agent, or Firm* — JCIPRNET (57) ABSTRACT

Provided is a transfer apparatus. The transfer apparatus includes, in addition to a non-contact chuck that lifts and holds a workpiece in a non-contact manner, a plurality of ultrasonic vibrators that radiate ultrasonic waves. The plurality of ultrasonic vibrators are configured to radiate the ultrasonic waves to generate a standing wave that attracts the workpiece, and are configured for the non-contact chuck to hold the workpiece at a position where forces attracting in a plurality of directions toward outside of the workpiece are balanced when viewed from a direction facing the workpiece.

3 Claims, 7 Drawing Sheets

(56) References Cited

U.S. PATENT DOCUMENTS

| | | | |
|---|---|---|---|
| 2011/0011704 A1 | 1/2011 | Isobe | |
| 2012/0274011 A1* | 11/2012 | Schilp | B65G 49/061 269/21 |
| 2015/0321231 A1 | 11/2015 | Muisener et al. | |
| 2021/0060798 A1* | 3/2021 | Jeong | H01L 21/67132 |
| 2021/0066112 A1* | 3/2021 | Jeong | H01L 21/68714 |

FOREIGN PATENT DOCUMENTS

| | | |
|---|---|---|
| JP | 2014003238 | 1/2014 |
| JP | 2015216376 | 12/2015 |
| WO | 2009110552 | 9/2009 |

OTHER PUBLICATIONS

"Office Action of Taiwan Counterpart Application", issued on Nov. 28, 2022, with partial English translation thereof, p. 1-p. 8.
"Office Action of Taiwan Counterpart Application", issued on Feb. 2, 2023, with partial English translation thereof, pp. 1-10.

* cited by examiner

TRANSFER APPARATUS CAPABLE OF SUPPRESSING SIDE SLIP OF WORKPIECE LIFTED BY NON-CONTACT CHUCK

CROSS-REFERENCE TO RELATED APPLICATION

This application is a 371 application of the International PCT application serial no. PCT/JP2021/009036, filed on Mar. 8, 2021. The entirety of the above-mentioned patent application is hereby incorporated by reference herein and made a part of this specification.

TECHNICAL FIELD

The present invention relates to a transfer apparatus including a non-contact chuck that lifts a workpiece in a non-contact manner.

RELATED ART

A non-contact chuck may be used in a process of polishing a semiconductor wafer or mounting a semiconductor chip obtained by dicing a semiconductor wafer (see, for example, Patent Literature 1). Though the non-contact chuck can lift the workpiece and hold it in a non-contact manner, the force for holding the workpiece is weak. Therefore, there is concern that the workpiece may move in the horizontal direction and slip off the non-contact chuck, or the relative position between the non-contact chuck and the workpiece may shift.

CITATION LIST

Patent Literature

[Patent Literature 1] Japanese Patent Lain-Open No. 2014-3238

SUMMARY OF INVENTION

Technical Problem

In order to regulate the horizontal movement of the workpiece, for example, it is conceivable to attach to the transfer apparatus a guide that comes into contact with an end surface of the workpiece. In order to minimize contact with the workpiece and maintain cleanliness, it is preferable that even the guide does not come into contact with the workpiece. Therefore, the present invention provides a transfer apparatus capable of suppressing a side slip of a workpiece lifted by a non-contact chuck.

Solution to Problem

An aspect of the present invention is a transfer apparatus including a non-contact chuck that lifts and holds a workpiece in a non-contact manner. The transfer apparatus further includes a plurality of ultrasonic vibrators that radiate ultrasonic waves. The plurality of ultrasonic vibrators are configured to radiate the ultrasonic waves to generate a standing wave that attracts the workpiece, and are configured for the non-contact chuck to hold the workpiece at a position where forces attracting in a plurality of directions toward outside of the workpiece are balanced when viewed from a direction facing the workpiece.

According to this aspect, the workpiece can be lifted in the vertical direction by the non-contact chuck, and the movement of the workpiece in the horizontal direction can be suppressed by the plurality of ultrasonic vibrators. The plurality of ultrasonic vibrators can interfere with ultrasonic waves to generate a standing wave region at a predetermined position of the non-contact chuck. When a standing wave is generated, the workpiece is attracted to the position of the node of the standing wave having low potential energy. If the standing wave region is generated in a plurality of directions viewed from the workpiece, the workpiece can be captured at a position where the attractive forces are balanced to suppress a side slip. Further, by gradually shifting the standing wave region surrounding the workpiece, the workpiece following the standing wave region can be moved to a desired position. The relative position between the non-contact chuck and the workpiece can be finely adjusted even after the workpiece is lifted.

In the above aspect, it is preferable that the non-contact chuck is a Bernoulli chuck including an injection hole for injecting gas and a suction surface formed around the injection hole. The plurality of ultrasonic vibrators are provided on the suction surface.

If the flow velocity of the gas is constant, the plurality of ultrasonic vibrators can generate a standing wave region at a predetermined position. Since the flow velocity of the airflow radiating from the injection hole of the Bernoulli chuck along the suction surface is substantially constant, it is suitable for the plurality of ultrasonic vibrators to generate a standing wave region. According to this aspect, the side slip of the workpiece can be stably suppressed by combining the ultrasonic vibrator with a compatible non-contact chuck.

In the above aspect, it is preferable that the plurality of ultrasonic vibrators include at least three pairs of a pair of ultrasonic vibrators that generate a standing wave, and the pair of ultrasonic vibrators are arranged at each of first to third positions surrounding the workpiece from three sides.

According to this aspect, a standing wave region can be generated at each of the first to third positions. If the workpiece is pulled at two points, the workpiece may slip sideways in the intersection direction in the direction of passing through the two points. By pulling the workpiece at three or more points, the side slip of the workpiece can be stably suppressed.

In the above aspect, it is preferable that the plurality of ultrasonic vibrators are arranged in a grid pattern.

According to this aspect, since the ultrasonic vibrators at suitable positions can be selected and driven from the plurality of ultrasonic vibrators arranged in a grid pattern according to the outer shape of the workpiece, it is possible to handle the workpiece of various sizes and shapes. Since a large number of ultrasonic vibrators can be driven at the same time, a stronger standing wave can be generated compared with the case of a pair of ultrasonic vibrators. When finely adjusting the relative position between the non-contact chuck and the workpiece, the ultrasonic vibrators to be driven can be optimized to move the workpiece precisely.

Effects of Invention

According to the present invention, it is possible to provide a transfer apparatus capable of suppressing a side slip of a workpiece lifted by a non-contact chuck.

DESCRIPTION OF EMBODIMENTS

Exemplary embodiments of the present invention will be described with reference to the accompanying drawings. Further, in each of the drawings, the parts denoted by the same reference numerals have the same or similar configurations. A transfer apparatus 1 of an embodiment of the present invention includes, in addition to a non-contact chuck 2 such as a Bernoulli chuck that lifts a workpiece W in the vertical direction Z (see FIG. 1), a plurality of ultrasonic vibrators 3 that suppress the movement of the workpiece W in the horizontal direction (X, Y).

Figure 1:
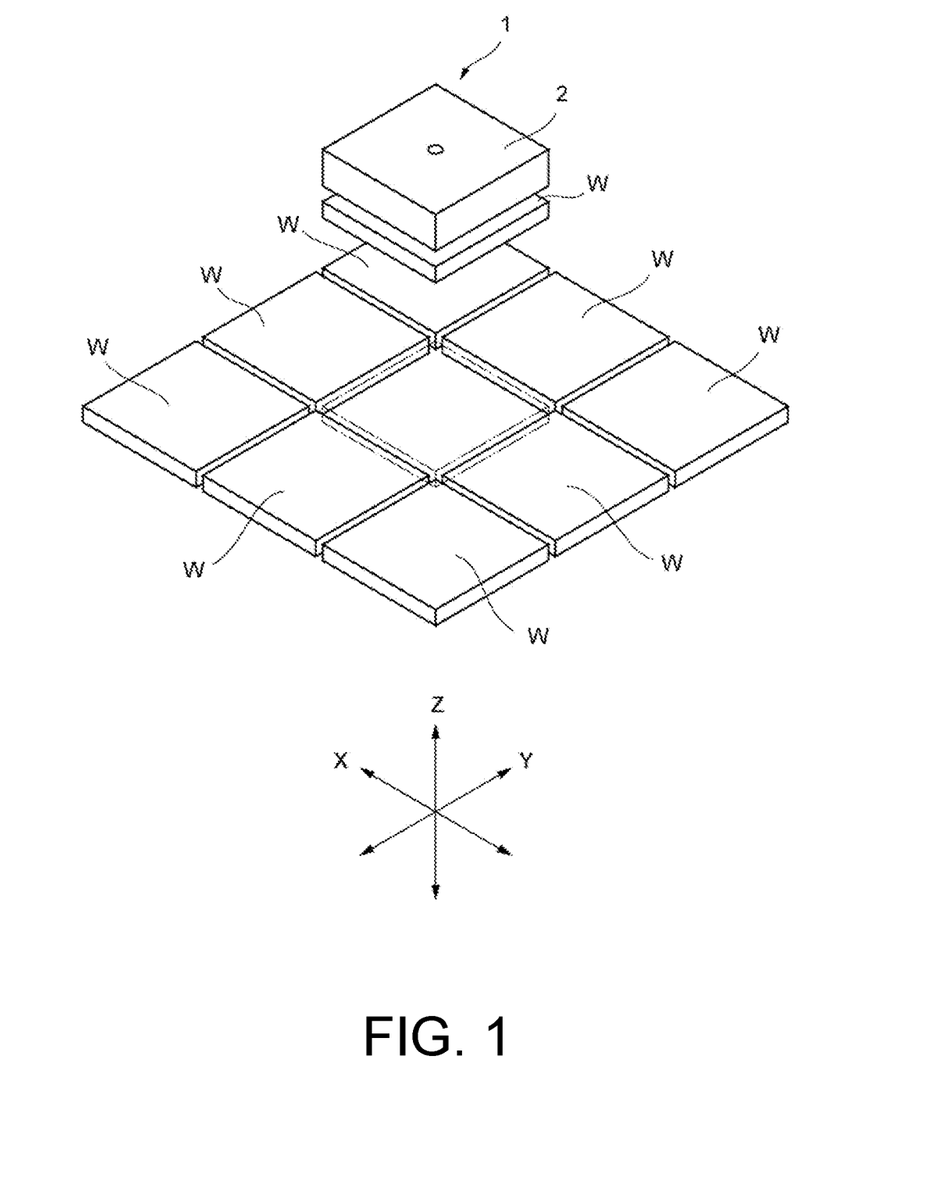
FIG. 1 is a perspective view showing the transfer apparatus according to an embodiment of the present invention.
Figure 2:
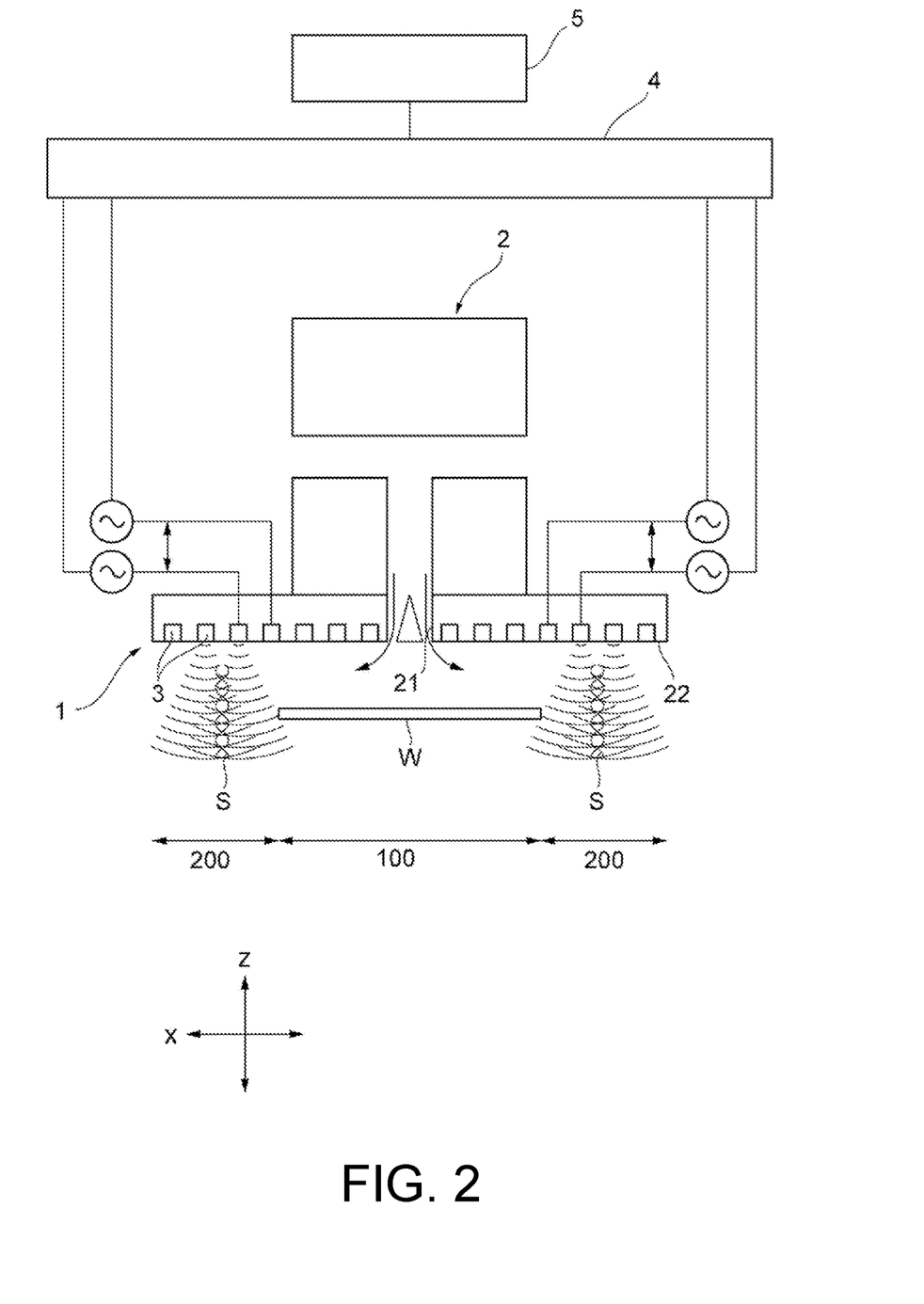
FIG. 2 is a cross-sectional view schematically showing a main part of the transfer apparatus shown in FIG. 1.

The plurality of ultrasonic vibrators 3 radiate ultrasonic waves to generate a standing wave region S in a region 200 outside the workpiece W (see FIG. 2). When a standing wave is generated, the workpiece W is attracted to the position of the node of the standing wave having low potential energy. If the standing wave region S is generated in a plurality of directions (for example, four directions in front, back, left and right, preferably 360° in all directions) viewed from the workpiece W (see FIGS. 3 and 5 to 7), the workpiece W can be captured at a position where the attractive forces are balanced to suppress a side slip. When the standing wave region S surrounding the workpiece W is shifted little by little, the workpiece W follows the standing wave region S (see FIG. 4). Since the relative position between a suction surface 22 of the non-contact chuck 2 and the workpiece W can be finely adjusted even after the workpiece W is lifted, the workpiece W such as a semiconductor chip can be precisely aligned with a substrate or the like. Hereinafter, each configuration will be described in detail with reference to FIGS. 1 to 7.

FIG. 1 is a perspective view showing the transfer apparatus 1 according to an embodiment of the present invention. As shown in FIG. 1, the transfer apparatus 1 includes the non-contact chuck 2 that lifts and holds the workpiece W in a non-contact manner. The transfer apparatus 1 is used, for example, in a die bonding apparatus or a pickup apparatus in a semiconductor manufacturing process. In the example shown here, the transfer apparatus 1 picks up a semiconductor chip which is an example of the workpiece W.

The semiconductor chip is made by dicing a semiconductor wafer into individual pieces, and is processed into an LSI package or the like through a bonding process in subsequent processes. The distance between adjacent semiconductor chips is about the same as the thickness of the dicing cutter and is, for example, about 100 μm. The transfer apparatus 1 may be applied to a wire bonding method in which a semiconductor chip is picked up and placed on a substrate or the like with the active surface facing up. The transfer apparatus 1 may be applied to a flip chip bonding method in which a semiconductor chip is picked up and placed on a substrate or the like with the active surface facing down.

FIG. 2 is a cross-sectional view schematically showing a main part of the transfer apparatus 1 shown in FIG. 1. In the example shown here, the non-contact chuck 2 is a Bernoulli chuck, and includes an injection hole 21 for injecting gas and the suction surface 22 formed around the injection hole 21. The non-contact chuck 2 is not limited to the Bernoulli chuck, and may be another type of non-contact chuck. For example, the non-contact chuck 2 may be a combination of an electromagnet that attracts the workpiece W by a magnetic force and an air blow that separates the workpiece by a force that balances the magnetic force.

In the Bernoulli chuck, when gas is injected from the injection hole 21, a gas layer is formed between the workpiece W and the suction surface 22, and the workpiece W can be held in a non-contact manner. The gas may be air or another type of gas. The injection hole 21 for injecting gas is formed in an annular shape, for example. The suction surface 22 surrounding the injection hole 21 is a flat surface extending along the horizontal direction (X, Y), and can define a uniform flow path facing the flat workpiece W.

As shown in FIG. 2, in addition to the non-contact chuck 2, the transfer apparatus 1 further includes the plurality of ultrasonic vibrators 3, an oscillator 4 that supplies high-frequency power to the ultrasonic vibrator 3, and a control part 5 that controls the oscillator 4. The ultrasonic vibrator 3 is an electromechanical converter that converts high-frequency power supplied from the oscillator 4 into ultrasonic vibration.

Each ultrasonic vibrator 3 is, for example, an ultrasonic speaker, and is configured by a unimorph vibrator or the like in which piezoelectric ceramics are bonded to one side of a metal disk. The configuration of the ultrasonic vibrator 3 is not particularly limited, and a known configuration can be appropriately selected. Each ultrasonic vibrator 3 is embedded in the suction surface 22 and emits ultrasonic waves (compression waves) downward in the vertical direction Z. When the ultrasonic waves radiated from the plurality of ultrasonic vibrators 3 interfere with each other, a standing wave is generated and the nodes and antinodes of the standing wave appear in the vertical direction Z every ½ wavelength.

The oscillator 4 can change the phase and frequency of the high-frequency power supplied to each ultrasonic vibrator 3 as desired according to a command from the control part 5. Further, the oscillator 4 can switch between the ultrasonic vibrator 3 to which high-frequency power is supplied and the ultrasonic vibrator 3 to which high-frequency power is not supplied as desired according to a command from the control part 5. The control part 5 can change the position of the amplitude of the standing wave generated by the plurality of ultrasonic vibrators 3 by controlling the high-frequency power supplied by the oscillator 4 to each ultrasonic vibrator 3.

Figure 3:
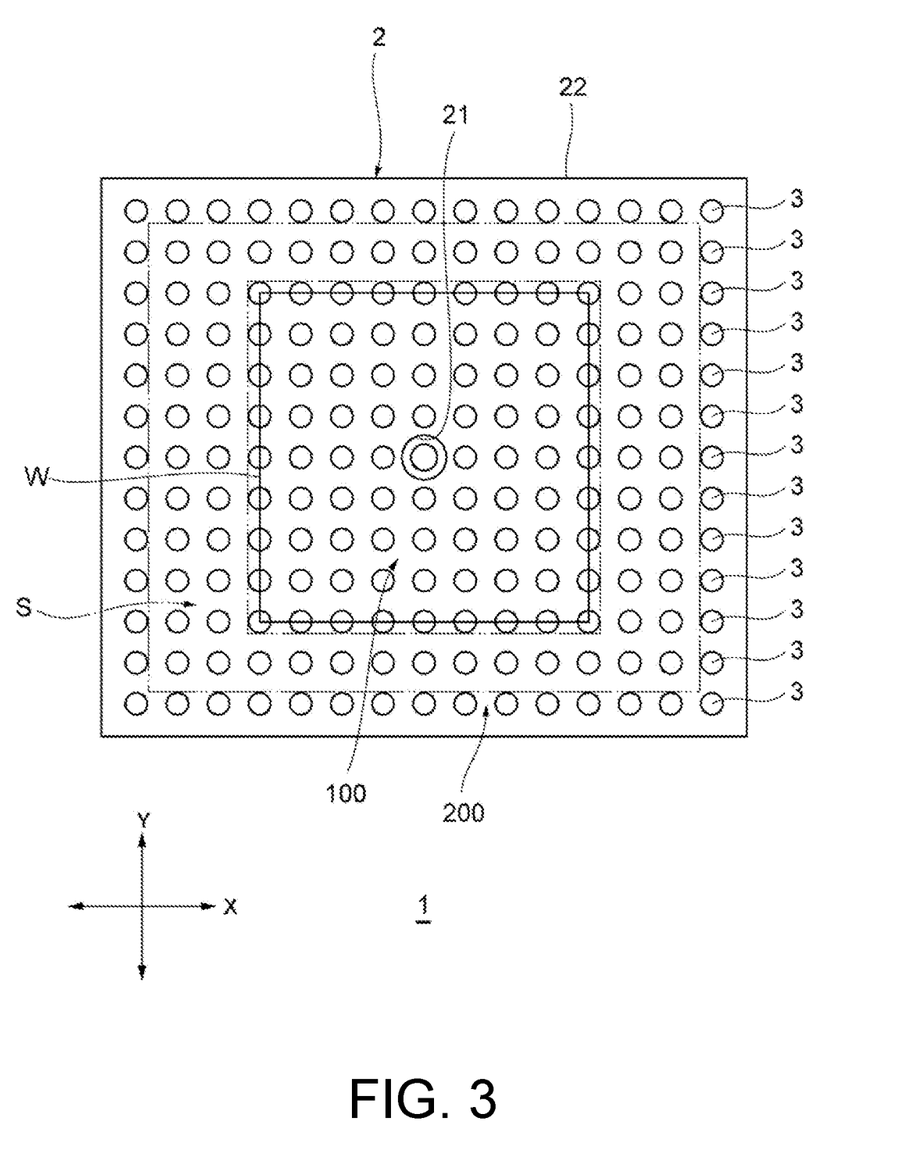
FIG. 3 is a bottom view of the transfer apparatus shown in FIG. 2 as viewed from below in the vertical direction in which the non-contact chuck faces the workpiece.

FIG. 3 is a bottom view of the transfer apparatus 1 shown in FIG. 2 as viewed from below in the vertical direction Z in which the non-contact chuck 2 faces the workpiece W. As shown in FIG. 3, the plurality of ultrasonic vibrators 3 are provided on the suction surface 22 of the non-contact chuck 2. In the example shown here, the plurality of ultrasonic vibrators 3 are arranged in a grid pattern at equal intervals in the front-back and left-right directions. The horizontal direction (X, Y) described above includes the left-right direction X and the front-back direction Y.

When the suction surface 22 of the non-contact chuck 2 is viewed from the vertical direction Z facing the workpiece W, the region overlapping the workpiece W is defined as a region 100 inside the workpiece W, and the region not overlapping the workpiece W is defined as the region 200 outside the workpiece W. In the present embodiment, the plurality of ultrasonic vibrators 3 driven by the control part 5 and the oscillator 4 generate a standing wave region S in the region 200 outside the workpiece W when viewed from the vertical direction Z in which the suction surface 22 faces the workpiece W, which is a space near the surface of the suction surface 22 of the non-contact chuck 2.

Further, a part of the standing wave region S may overlap the region 100 inside the workpiece W. The standing wave region S is not limited to the case where it is strictly generated in the region 200 outside the workpiece W, and may be near the outer circumference of the workpiece W. When a standing wave is generated, the workpiece W is attracted to the position of the node of the standing wave having low potential energy. If the standing wave region S is generated in a plurality of directions viewed from the workpiece W, the workpiece W can be captured at a position where the attractive forces are balanced to suppress a side slip.

The plurality of ultrasonic vibrators 3 arranged in a grid pattern may simultaneously drive a large number of ultrasonic vibrators 3 to generate a standing wave region S, or may drive the ultrasonic vibrators 3 located near the boundary between the region 100 inside the workpiece W and the region 200 outside the workpiece W in a limited manner to generate the standing wave region S. Since the ultrasonic vibrators 3 at suitable positions can be selected and driven from the plurality of ultrasonic vibrators 3 according to the outer shape of the workpiece W, it is possible to handle the workpiece W of various sizes and shapes. As the number of driven ultrasonic vibrators 3 increases, even if each ultrasonic vibrator 3 is small, a standing wave having a large amplitude can be generated; therefore, the force for trapping the workpiece W becomes stronger.

Figure 4:
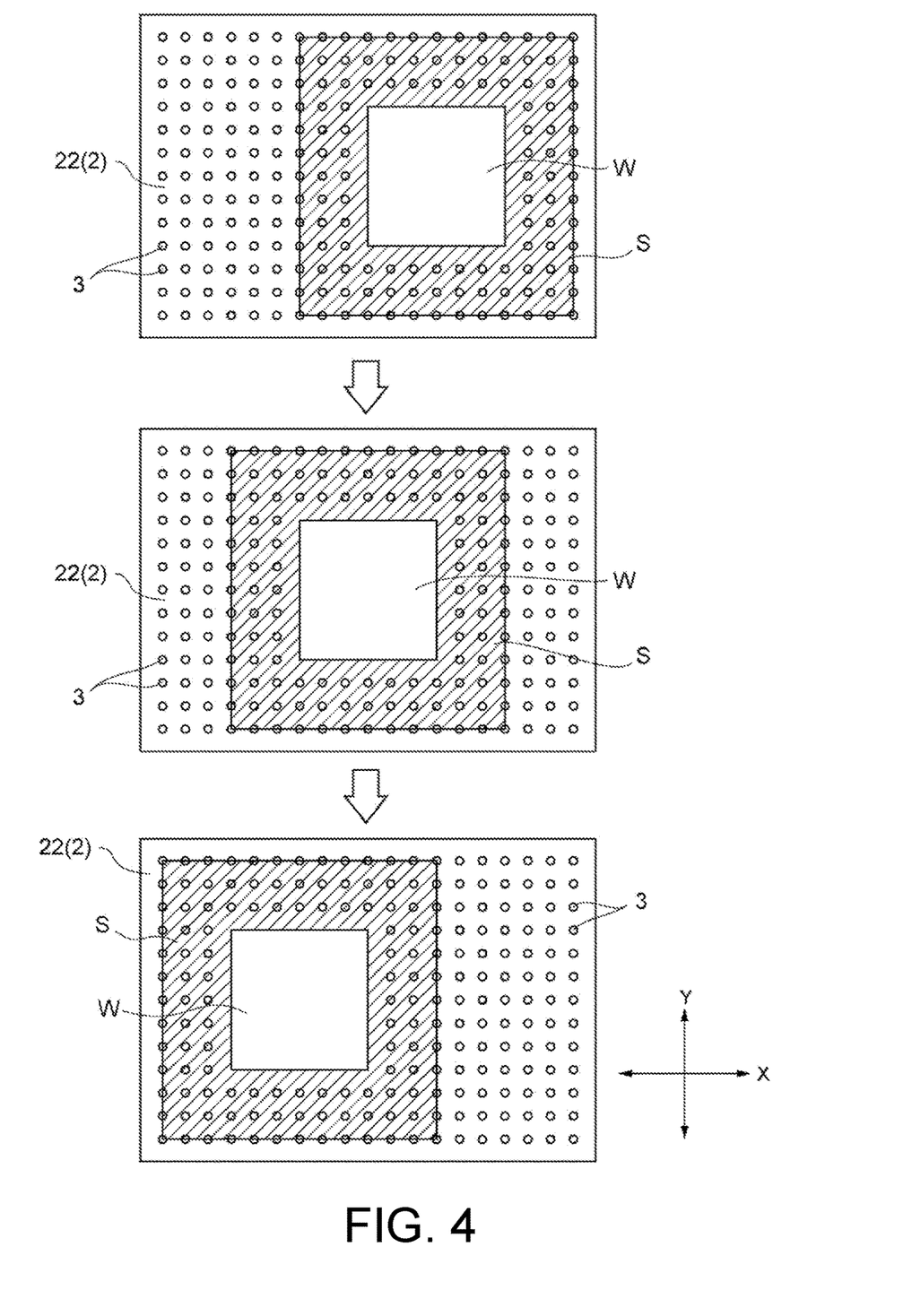
FIG. 4 is a bottom view schematically showing an operation in which the workpiece follows the standing wave region by gradually shifting the standing wave region surrounding the workpiece.

FIG. 4 is a bottom view schematically showing an operation in which the workpiece follows the standing wave region by gradually shifting the standing wave region S surrounding the workpiece W. The transfer apparatus 1 of the present embodiment can not only suppress the side slip of the workpiece W, but can also finely adjust the relative position between the non-contact chuck 2 and the workpiece W. As shown in FIG. 4, if a plurality of ultrasonic vibrators 3 are arranged in a grid pattern and the driven ultrasonic vibrators 3 are gradually switched to slowly move the standing wave region S, the workpiece W follows the movement of the standing wave region S.

Figure 5:
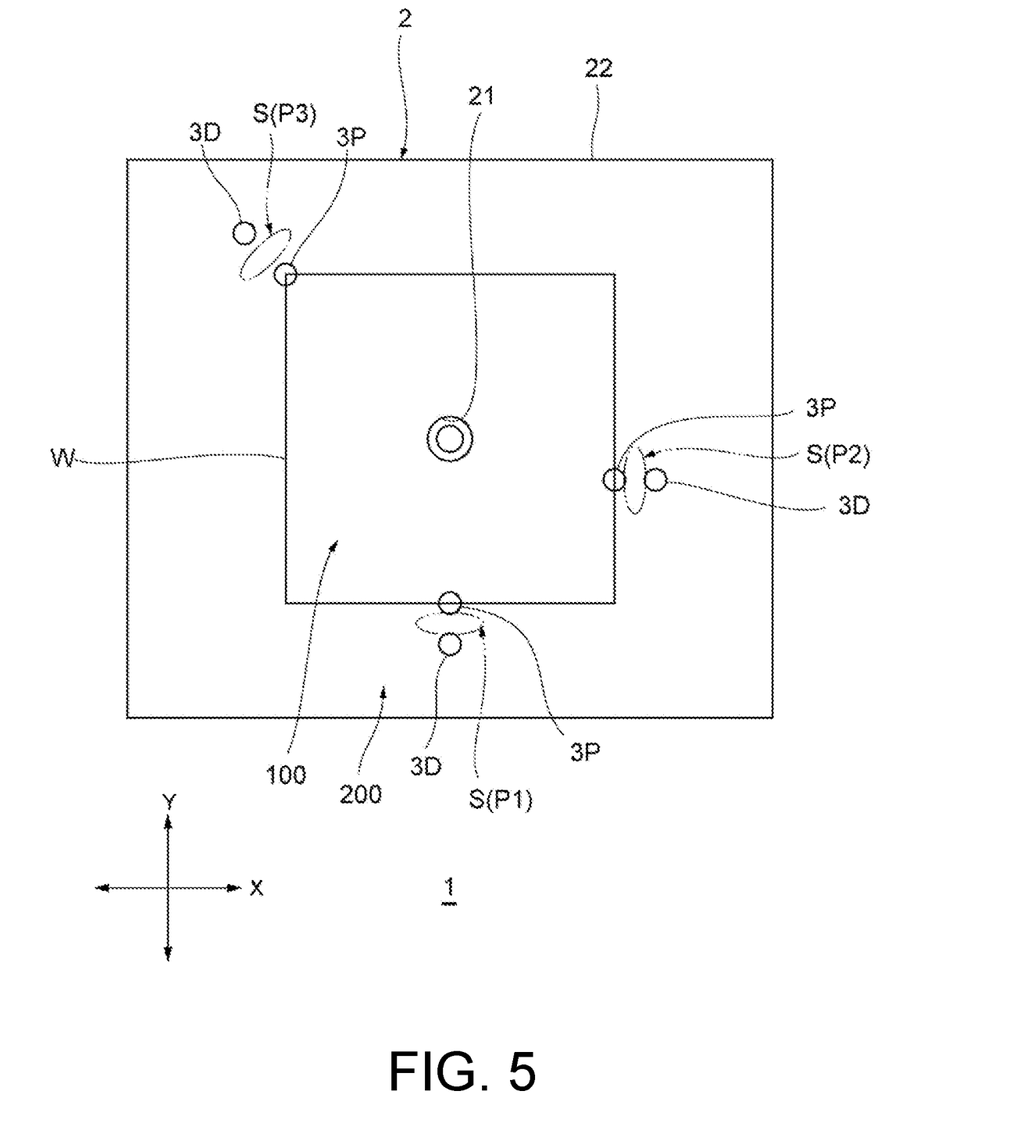
FIG. 5 is a bottom view showing a first modified example in which a pair of ultrasonic vibrators are provided at each of the first to third positions surrounding the workpiece from three sides.

FIG. 5 is a bottom view showing a first modified example in which a pair of ultrasonic vibrators 3P and 3D are provided at each of the first to third positions P1, P2 and P3 surrounding the workpiece W from three sides. When the workpiece W is constrained at three points, the plurality of ultrasonic vibrators 3 may include at least three pairs of the pair of ultrasonic vibrators 3P and 3D that interfere with each other to generate the standing wave region S.

Each of the pair of ultrasonic vibrators 3P and 3D includes an ultrasonic vibrator 3P proximal to the center of the workpiece W and a vibrator 3D distal to the center of the workpiece W. In the example shown here, in the rectangular workpiece W, the first position P1 is located near the midpoint of any side (hereinafter referred to as the first side); the second position P2 is located near the midpoint of a side orthogonal to the first side (hereinafter referred to as the second side); and the third position P3 is located near the apex located diagonally to the apex shared by the first side and the second side.

Figure 6:
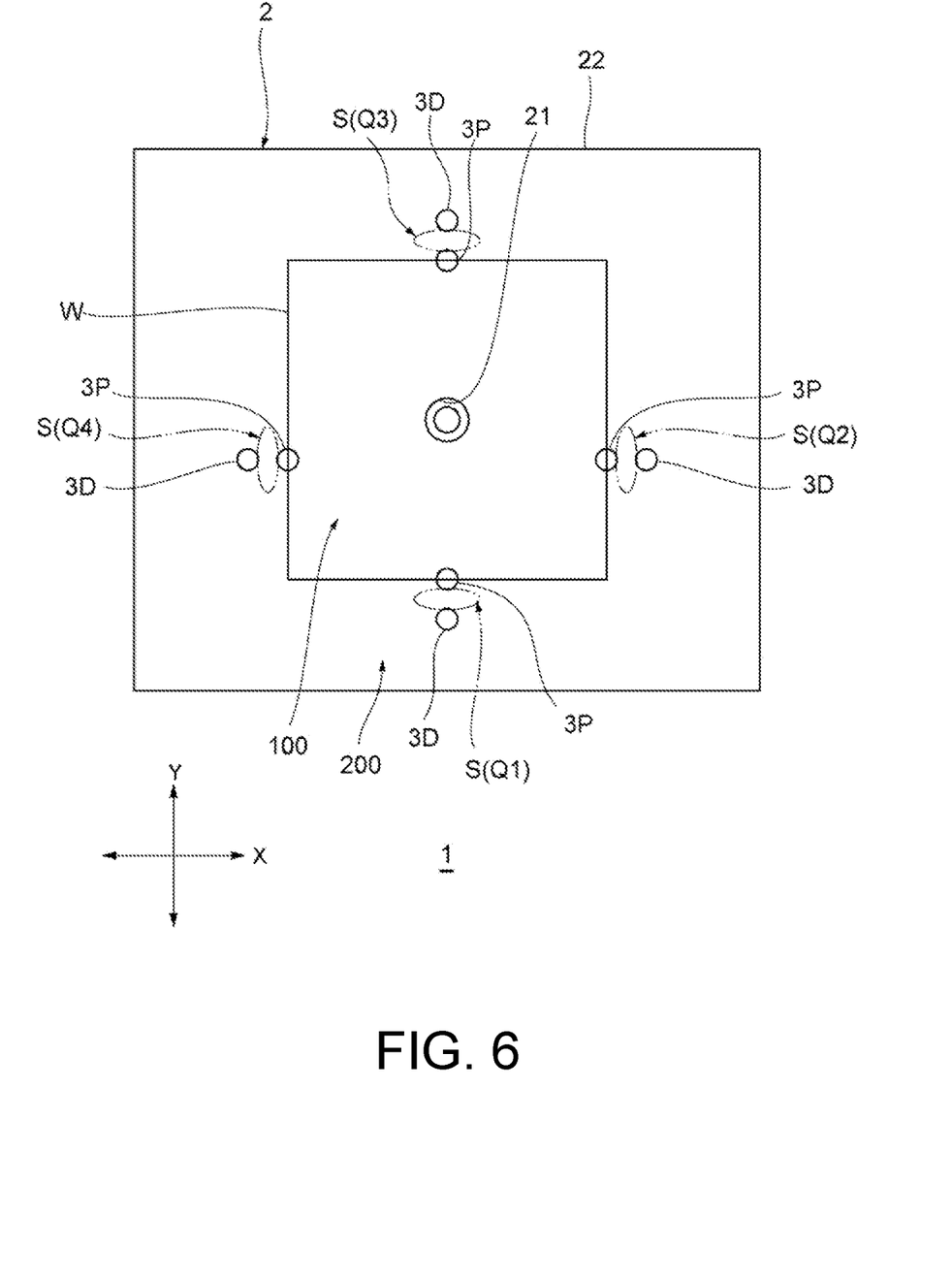
FIG. 6 is a bottom view showing a second modified example in which a pair of ultrasonic vibrators are provided at each of the first to fourth positions for suppressing movement in the left-right direction and the front-back direction.

FIG. 6 is a bottom view showing a second modified example in which a pair of ultrasonic vibrators 3P and 3D are provided at each of the first to fourth positions Q1, Q2, Q3 and Q4 for suppressing movement in the left-right direction X and the front-back direction Y. When the workpiece is restrained at four points in order to suppress the movement of the left-right direction X and the front-back direction Y, for example, at least a pair of ultrasonic vibrators 3P and 3D may be arranged near the midpoint of each side of the rectangular workpiece W.

Figure 7:
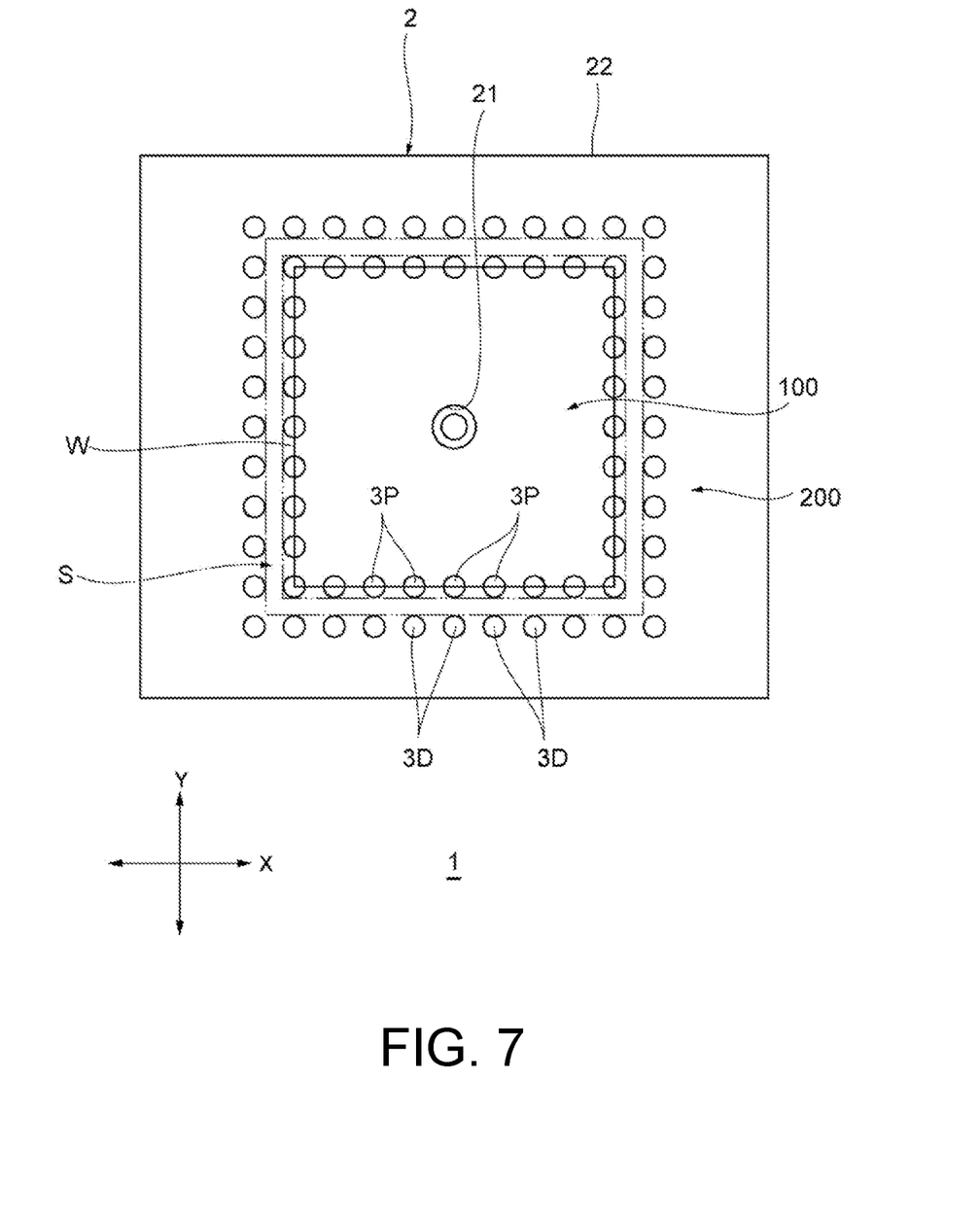
FIG. 7 is a bottom view showing a third modified example in which the plurality of ultrasonic vibrators are arranged in two rows along the outer shape of the workpiece.

FIG. 7 is a bottom view showing a third modified example in which the plurality of ultrasonic vibrators 3 are arranged in two rows along the outer shape of the workpiece W. As shown in FIG. 7, the ultrasonic vibrators 3P proximal to the center of the workpiece W are arranged in a row along the outer shape of the workpiece W. The ultrasonic vibrators 3D distal to the center of the workpiece W are arranged in a row so as to surround the ultrasonic vibrators 3P proximal to the center of the workpiece W. That is, the plurality of ultrasonic vibrators 3 surround the workpiece W in a double frame shape.

A frame-shaped standing wave region S surrounding the workpiece W is generated between the row of the ultrasonic vibrators 3P proximal to the center of the workpiece W (hereinafter referred to as the first row) and the row of the ultrasonic vibrators 3D distal to the center of the workpiece W (hereinafter referred to as the second row). When the workpiece W is surrounded by the ultrasonic vibrators 3P and 3D arranged in two rows in a frame shape, the side slip of the workpiece W can be stably suppressed regardless of the outer shape of the workpiece W. The distance between the ultrasonic vibrators 3P proximal to the center of the workpiece W does not have to be equal, and the distance between the ultrasonic vibrators 3D distal to the center of the workpiece W does not have to be equal. For example, the ultrasonic vibrators 3P and 3D may be arranged so as to surround only the four corners of the rectangular workpiece W in an L shape.

When the workpiece W is lifted by a non-contact chuck such as a Bernoulli chuck, the workpiece W tends to slip sideways. According to the transfer apparatus 1 of the present embodiment, the plurality of ultrasonic vibrators 3 provided on the suction surface 22 generate a standing wave that attracts the workpiece W, and the workpiece is held at a position where the forces attracting in multiple directions toward the outside 200 of the workpiece W are balanced. Therefore, the side slip of the workpiece W can be suppressed. It is particularly suitable for semiconductor manufacturing processes where the semiconductor chip must be precisely aligned with the substrate.

The embodiments described above are for facilitating the understanding of the disclosure, and are not for limiting and interpreting the disclosure. Each element included in the embodiments and its arrangement, material, condition, shape, size, and the like are not limited to those exemplified, and can be changed as appropriate. In addition, the configurations shown in different embodiments can be regionally replaced or combined. For example, when a large workpiece W such as a semiconductor wafer is lifted by a Bernoulli chuck, a plurality of injection holes 21 may be provided on the suction surface 22 on which the ultrasonic vibrators 3 are arranged.

What is claimed is:

1. A transfer apparatus comprising a non-contact chuck that lifts and holds a workpiece in a non-contact manner, the transfer apparatus further comprising:
   a plurality of ultrasonic vibrators that radiate ultrasonic waves,
   wherein the plurality of ultrasonic vibrators are configured to radiate the ultrasonic waves to generate a standing wave that attracts the workpiece, and are configured for the non-contact chuck to hold the workpiece at a position where forces attracting in a plurality of directions toward outside of the workpiece are balanced when viewed from a direction facing the workpiece,
   wherein the non-contact chuck is a Bernoulli chuck comprising:
      an injection hole for injecting gas, and
      a suction surface formed around the injection hole,
   wherein the suction surface surrounding the injection hole is a flat surface extending along a horizontal direction,
   wherein the injection hole is configured to inject the gas to form a gas layer between the workpiece and the suction face,
   wherein the plurality of ultrasonic vibrators are provided on the suction surface,
   wherein each of the plurality of ultrasonic vibrators is embedded in the suction surface and emits ultrasonic waves downward in the vertical direction.

2. The transfer apparatus according to claim 1, wherein the plurality of ultrasonic vibrators comprise at least three pairs of a pair of ultrasonic vibrators that generate a standing wave, and
   the pair of ultrasonic vibrators are arranged at each of first to third positions surrounding the workpiece from three sides.

3. The transfer apparatus according to claim 1, wherein the plurality of ultrasonic vibrators are arranged in a grid pattern.

* * * * *